(12) United States Patent
Tauzin et al.

(10) Patent No.: US 9,105,688 B2
(45) Date of Patent: Aug. 11, 2015

(54) PROCESS FOR FORMING A CRACK IN A MATERIAL

(75) Inventors: Aurelie Tauzin, Saint Egreve (FR); Frederic Mazen, Saint Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/114,998

(22) PCT Filed: Apr. 27, 2012

(86) PCT No.: PCT/EP2012/057713
§ 371 (c)(1),
(2), (4) Date: Dec. 24, 2013

(87) PCT Pub. No.: WO2012/150184
PCT Pub. Date: Nov. 8, 2012

(65) Prior Publication Data
US 2014/0113434 A1    Apr. 24, 2014

(30) Foreign Application Priority Data

May 2, 2011    (FR) ...................................... 11 53737

(51) Int. Cl.
*H01L 21/46* (2006.01)
*H01L 21/762* (2006.01)
(52) U.S. Cl.
CPC ................................ *H01L 21/76254* (2013.01)
(58) Field of Classification Search
CPC ............................................... H01L 21/76254
USPC ................................................ 438/458, 455
See application file for complete search history.

(56) References Cited

U.S. PATENT DOCUMENTS 5,877,077 A    3/1999    Kronlund
6,544,862 B1 *    4/2003    Bryan ........................... 438/455
(Continued)

FOREIGN PATENT DOCUMENTS

| WO | 2004 042779 | 5/2004 |
|---|---|---|
| WO | 2005 080645 | 9/2005 |
| WO | 2007 110515 | 10/2007 |

OTHER PUBLICATIONS

Barbier, G. et al., "Effects of lithium-implantation on the hydrogen retention in both a-C:H and a-SiC :H materials submitted to deuterium bombardment", Journal of Nuclear Materials, vol. 241-243, pp. 1036-1040, XP004403138, (Feb. 11, 1997).

(Continued)

*Primary Examiner* — Bradley K Smith
(74) *Attorney, Agent, or Firm* — Oblon, McClelland, Maier & Neustadt, L.L.P.

(57) ABSTRACT

A process for forming a layer (26) of semiconductor material from a substrate (20), or donor substrate, made of the same semiconductor material is described, comprising:
  formation in said donor substrate of a high lithium concentration zone (22), with a concentration between $5 \times 10^{18}$ atoms/cm$^3$ and $5 \times 10^{20}$ atoms/cm$^3$,
  then a hydrogen implantation (24) in the donor substrate, in, or in the vicinity of, the high lithium concentration zone,
  application of a stiffener (19) with the donor substrate,
  application of a thermal budget to result in the detachment of the layer (34) defined by the implantation.

15 Claims, 5 Drawing Sheets

(56) References Cited

U.S. PATENT DOCUMENTS

2005/0181210 A1     8/2005   Doering et al.
2009/0061594 A1*   3/2009   Tauzin et al. ................. 438/458

OTHER PUBLICATIONS

International Search Report Issued Oct. 2, 2012 in PCT/EP12/057713 Filed Apr. 27, 2012.

Preliminary Search Report issued Jul. 20, 2011 in French Patent Application No. FR 1153737 FA 750609 (with English translation of category of cited Documents).

C. Lagahe-Blanchard, et al, "Hydrogen and Helium Implantation to achieve layer transfer", Semiconductor Wafer Bonding VII: Science, Technology, and Applications, Apr.-May 2003, Electrochemical Society, vol. PV2003-19, 7 pages.

Aditya Agarwal, et al., "Efficient production of silicon-on-insulator films by co-implantation of He+ with H+", Applied Physics Letters, vol. 72, No. 9, Mar. 1998, 3 pages.

Ali M. Mousa, et al., "Profiling of Lithium and Potassium into Silicon", Turk J Phys, 30, 2006, pp. 15-20.

A. Keffous, et al., "Lithium diffusion profile onto highly resistive p-type silicon", Science Direct, Vacuum 81, 2006, pp. 417-421 www.sciencedirect.com.

C. S. Fuller, "Interactions Between Solutes in Germanium and Silicon", Chem. Rev., 1959, 59, (1), pp. 65-87.

Phuong Nguyen, et al., "Systematic Study of the Splitting Kinetic of H/He Co-Implanted Substrate", Proceedings of the 2003 IEEE International SOI Conference, Sep.-Oct. 2003, IEEE, pp. 132-134.

\* cited by examiner

PROCESS FOR FORMING A CRACK IN A MATERIAL

CROSS REFERENCE TO RELATED APPLICATIONS

The present application is a 35 U.S.C. §371 national stage patent application of International patent application PCT/EP2012/057713, filed on Apr. 27, 2012, published as WO/2012/150184 on Nov. 8, 2012, the text of which is incorporated by reference, and claims the benefit of the filing date of French application no. 11 53737, filed on May 2, 2011, the text of which is also incorporated by reference.

FIELD OF THE INVENTION AND PRIOR ART

The invention relates to processes for creating fractures in substrates, such as semiconductor substrates.

It particularly applies to the manufacture of thin layers for microelectronics.

The "Smart Cut"™ process is known, which is suitable for detaching a thin film and transferring same onto a stiffener according to the following steps, which will be described with reference to FIGS. 1A-1D.

In a first step (FIG. 1A), ion implantation of one (or a plurality of) gas species (for example hydrogen, helium, etc.), is performed in a donor substrate 2, via a surface 2' thereof. This forms an implantation zone 6, the ion concentration of which is sufficient to create a layer of microcavities (FIG. 1B). The implantation is generally hydrogen or helium implantation at an energy of 10 to 210 keV, and at a dose of some $10^{16}$ to $10^{17}/cm^2$.

The surface 2' of the donor substrate 2 is then placed in intimate contact with a recipient substrate 8 (FIG. 1C).

A fracture is then formed at the microcavity zone 6, by applying a heat treatment and/or detachment strain. In the case of a heat treatment, the treatment is performed by applying a temperature within a range substantially between 300° C. and 700° C. To apply a detachment strain, a blade may be inserted between the two substrates 2, 8 and/or tensile and/or bending and/or shearing loads, and/or also ultrasound or microwaves may be applied.

A fracture is obtained, along with a layer 4 of material from the donor substrate 2, mounted on the recipient substrate 8, as illustrated in FIG. 1D.

The remaining portion $2_1$ of the donor substrate 2 may then be recycled and particularly reused to repeat the same cycle.

Various alternative embodiments of this process have been proposed, in order to reduce the implantation dose 4 required for fracture formation, or to lower the fracture formation treatment temperature.

In this way, it is known that He—H co-implantation makes it possible to lower the fracture formation temperature and/or the dose required to obtain fracture formation, as described in the article by C. Lagahe-Blanchard et al., Proceedings on the Semiconductor Wafer Bonding VII: Science, Technology, and Applications, Paris, France, 27 Apr.-2 May 2003 Electrochemical Society, Pennington, N.J., 2003, Vol. PV2003-19, p. 346.

This He—H co-implantation is very effective for reducing the total dose required for fracture formation, or for reducing the fracture formation annealing temperature, or for reducing the roughness of the layers after fracture formation.

However, this technique is highly sensitive to the implantation parameters. In particular, the relative distance between the hydrogen and helium implantation zones or peaks, respectively, or the order in which the implantations are performed, or even the He/H dose ratio, have a strong influence on the total dose or on the fracture annealing temperature or on the features of the film resulting from fracture formation, or even on obtaining the fracture itself.

The optimal implantation conditions have not been identified to date. The literature contains various indications, which are not necessarily consistent with each other, in relation to these conditions.

Furthermore, the mechanisms of He—H co-implantation appear to be complex, which complicates the use of this technique.

According to a further method, from the documents Appl. Phys. Lett., Vol. 72, p. 49, 1998, or U.S. Pat. No. 5,877,077, it is known that boron and hydrogen co-implantation makes it possible to lower the fracture formation temperature to 200° C. Boron implantation has numerous advantages: in particular, this element is used routinely in microelectronics, facilitating the integration thereof for an industrial process.

However, the boron atom is heavier than that of hydrogen or helium. Therefore, it causes more damage to the material of the substrate wherein it is implanted, which may have an adverse effect on the quality of the layers. Furthermore, for a given implantation energy, the implantation depth decreases when the ion mass increases. It is thus not possible, with a conventional implanter (limited in energy) to implant boron at depth (typically more than 100 nm).

Therefore, the problem arises of finding a novel process not involving the above limitations.

The problem also arises of finding a novel process for reducing the implantation dose and/or thermal budget used for fracture formation.

DESCRIPTION OF THE INVENTION

A novel process, involving the formation of a high lithium concentration zone followed by hydrogen implantation, is described.

This process comprises:
  formation in a silicon substrate of a high lithium concentration zone, with a concentration between $5 \times 10^{18}$ atoms/cm$^3$ and $5 \times 10^{20}$ atoms/cm$^3$,
  and hydrogen implantation in or in the vicinity of the high lithium concentration zone.

It is thus possible to carry out a process for forming a layer of silicon from a silicon substrate, or donor substrate, comprising:
  formation in said donor substrate of a high lithium concentration zone, with a concentration between $5 \times 10^{18}$ atoms/cm$^3$ and $5 \times 10^{20}$ atoms/cm$^3$,
  then hydrogen implantation in the donor substrate, in, or in the vicinity of, the high lithium concentration zone,
  application of a stiffener with the donor substrate,
  application of at least one thermal budget to result in the detachment of the layer defined by the implantation.

The formation of a high lithium concentration zone makes it possible to form effective traps for hydrogen, lithium and hydrogen particularly having a strong chemical affinity.

The formation of the lithium implantation zone may be obtained by means of a first implantation with lithium ions, for example at a dose greater than $1 \times 10^{13}/cm^2$ (or between $10^{13}$ and $5 \times 10^{15}/cm^2$). The implantation energies are, in this case, preferably chosen such that the Li and H peaks are mutually located at the same depth, or situated at a small distance in relation to each other, this distance being less than or equal to, substantially, 200 nm or 150 nm.

The difference in implantation depth may be evaluated using simulators conventionally used in the field of implantation for many years. Mention may be made for example of the simulation software SRIM, available on the Internet. This difference may also be measured by means of Secondary Ionisation Mass Spectrometry (known under the acronym SIMS).

The implantation doses are chosen such that:
the lithium dose is less than $5.10^{15}$ Li/cm$^2$, preventing the amorphisation of the Si substrate (the maximum Li concentration is then approximately $4.10^{19}$/cm$^3$, the amorphisation limit being $4.10^{21}$/cm$^3$).
the hydrogen dose is between $4.10^{16}$ and $10^{17}$/cm$^2$.

Alternatively, lithium is introduced into the donor substrate by means of electrolysis or diffusion, for example after deposition or evaporation of the lithium on a surface of the substrate.

The hydrogen implantation is then preferably carried out such that the hydrogen peak (site of maximum hydrogen concentration) is located at a depth at which the lithium concentration in the Si substrate is in the region of $4.10^{19}$/cm$^3$ or between $5 \times 10^{16}$/cm$^3$ and $1 \times 10^{20}$/cm$^3$. Here again, it is possible to predict, using the tools mentioned above (SRIM or SIMS), the distance at which the sought concentration is obtained.

One advantage of this alternative embodiment is that it merely requires one implantation, preceded by a low-cost step, by means of electrolysis or diffusion.

In this case, the lithium implantation profile is substantially constant from the surface to a maximum insertion depth, the aim being for the mean hydrogen implantation depth in the donor substrate to be within this zone.

Diffusion, after deposition or evaporation on a surface of the substrate, is for example performed by means of heat treatment.

As a general rule, hydrogen implantation may be performed at a dose between $10^{16}$ atoms/cm$^2$ and $5.10^{17}$ atoms/cm$^2$.

As the thermal budget is reduced, in relation to the case of a single implantation, the donor substrate and the stiffener may have heat expansion coefficients wherein the difference is, in absolute terms, greater than $3.10^{-6}$ K$^{-1}$.

A process as described above is suitable for reducing the fracture formation heat treatment and/or the total implantation dose significantly.

The implementation of this process described above is easier than He—H co-implantation: indeed, it is simply necessary for the lithium to be introduced first and for the Li and H species to be close to each other. Furthermore, lithium is a light element, lighter than boron, the transferred layers are this of superior crystalline quality and it is possible with a standard implanter to transfer thicker layers than with boron (easily up to one micron for implantation and even beyond for diffusion).

DETAILED DESCRIPTION OF PARTICULAR EMBODIMENTS

A novel double-implantation formation process is described, using FIGS. 2A-2D.

In a first step (FIG. 2A), a silicon substrate 20 optionally provided with a surface layer of thermal oxide SiO$_2$ is selected.

This oxide (not shown specifically in the figures) may have a thickness of some tens or hundreds of nm, for example 50 nm or 100 nm.

Figure 2A:
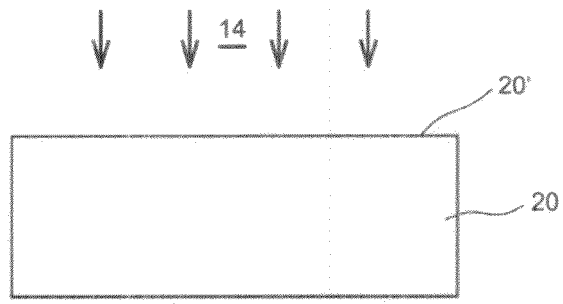
FIGS. 2A-2F represent steps from a novel implantation process.
Figure 2B:
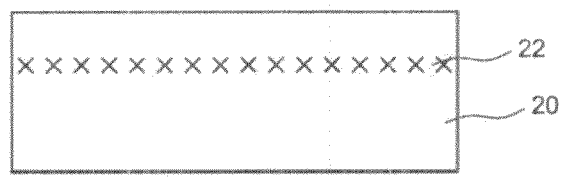

In this substrate, lithium implantation is performed, using a lithium ion beam 14, directed through a surface 20' of the substrate. This leads to the formation of a lithium-implanted zone 22 (FIG. 2B). In fact, the reference 22 denotes the lithium implantation peak, or maximum concentration zone situated at 960 nm below the implanted surface for an implantation energy of 210 keV.

Hydrogen ion implantation 18 is then performed (FIG. 2C), through the same surface 20' of the substrate 20 as that through which the lithium implantation was carried out. This leads to the formation of a hydrogen-implanted zone, wherein the implantation peak is identified in FIG. 2C by the reference 24 (FIG. 2D), situated substantially at the same depth as the lithium implantation peak.

The implantation surface 20' of the substrate 20 is then placed in intimate contact with a stiffener 19 (FIG. 2E), for example made of sapphire.

Figure 2C:
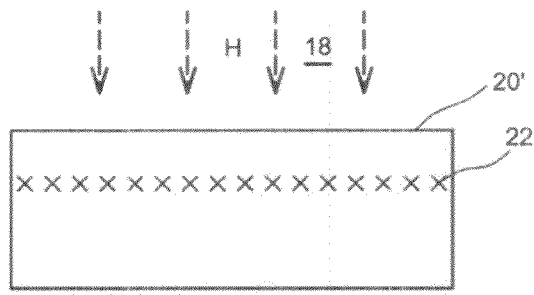
Figure 2D:
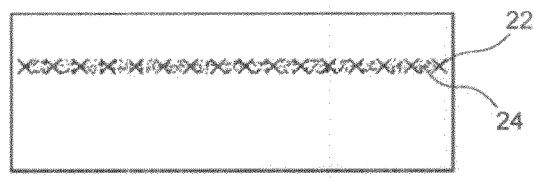
Figure 2E:
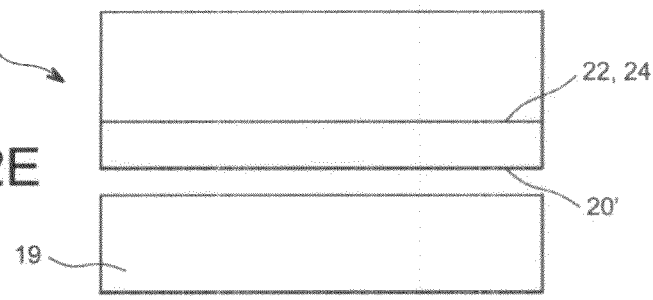
Figure 2F:
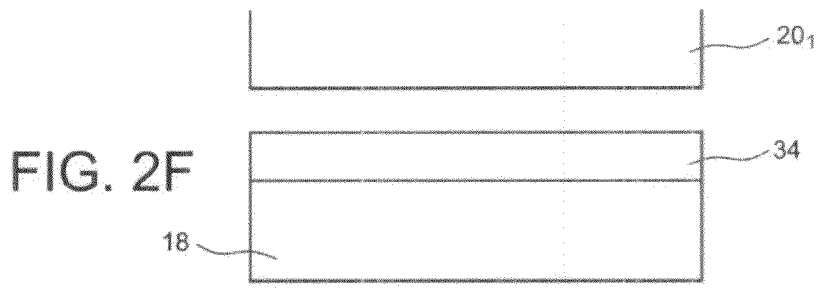

Fracture formation may then be performed on the microcavity layer, by applying a heat treatment and/or a detachment strain (FIG. 2F).

In the case of a heat treatment, a temperature is applied within a range substantially between 150° C. and 700° C., and typically between 200° C. and 400° C.

In order to apply a detachment strain, a blade may be inserted at the implanted zone 22, 24 of the substrate 20 and/or tensile and/or bending and/or shearing loads are applied to the substrate 20, and/or ultrasound or microwaves having a power and frequency within the range 10 to 100 kHz, for example between 10 and 50 kHz, for example 40 kHz, are further applied.

A fracture is obtained along the implanted zone 22, 24, as illustrated in FIG. 2F, with the formation of a thin layer 34 made of silicon 20 and optionally of the oxide layer, and a residual portion 20$_1$ of the substrate 20, which may then be recycled and particularly reused to repeat the same cycle.

Alternatively, a high lithium concentration zone 22 may be produced by means of a step for introducing lithium, by means of electrolysis or diffusion. The step in FIG. 2A is thus replaced by this electrolysis or diffusion step. The implantation profile is then constant from the surface down to a few microns (10 microns), or even some tens of microns (100 microns).

In the case of lithium introduction by means of electrolysis, the procedure described in the article by A. M. Mousa, entitled "Profiling of lithium and potassium into silicon", Turk J Phys, 30, 2006, 15-20 may be used: a silicon substrate is used as a cathode, and is immersed, with an anode, into a bath of a lithium salt (for example: LiBr) used as an electrolyte. Electrolysis is performed for a time for example between 5 minutes and 30 minutes, with a current between 1 mA and some tens of mA, for example mA. The distribution of lithium according to the depth thereof in the substrate may be evaluated by measuring the resistance using the 4-point method. These measurements may be pre-calibrated by means of SEM (scanning electron microscopy) observations.

In the case of lithium introduction by means of diffusion, the procedure described in the article by A. Keffous et al., entitled "Lithium diffusion profile onto highly resistive p-type silicon", Vacuum, 81, 2006, 417-421 may be used. Lithium is previously deposited onto a silicon substrate, by means of vacuum thermal evaporation, for example at about $10^{-6}$ Torr. The diffusion per se takes place by means of vacuum annealing, at several hundred degrees, for example between 300° C. and 800° C., for a time between a few minutes and some tens of minutes, for example between 5 min and 30 min. Here again, the distribution of lithium according to the depth thereof in the substrate may be evaluated by measuring the resistance using the 4-point method. Here again, these measurements may be pre-calibrated.

The implementation of either of these techniques is followed, as in FIG. 2C:
- by hydrogen ion implantation 18, to lead to the formation of hydrogen-lithium double implantation, as in FIG. 2D, and by intimate contact with a stiffener 19 (FIG. 2E),
- and, finally, by fracture formation at the microcavity layer, by applying a heat treatment and/or detachment strain (FIG. 2F).

Figure 3A:
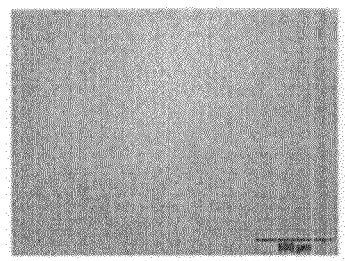
FIGS. 3A-3D are views illustrating comparisons of bubble formation by means of hydrogen implantation alone (FIGS. 3A and 3B) or by means of lithium and hydrogen co-implantation followed by annealing at 450° C. for 10 minutes (FIGS. 3C and 3D).
Figure 3C:
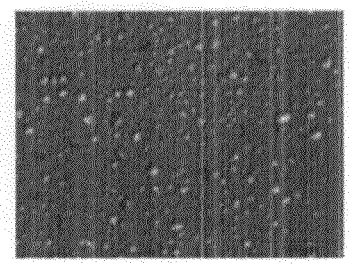
Figure 3B:
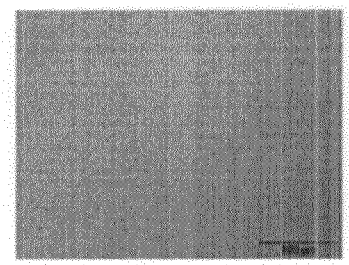
Figure 3D:
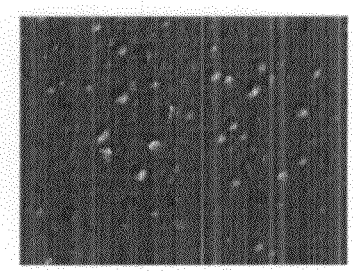

Experimental results will now be presented which will be illustrated using FIGS. 3A-3D, wherein:
- FIG. 3A is a picture of the surface of the implanted substrate after hydrogen implantation, alone, at 100 keV with a dose of $4.5.10^{16}$ H/cm$^2$,
- FIG. 3B is a picture of the surface of the implanted substrate after hydrogen implantation, alone, at 110 keV with a dose of $4.5.10^{16}$ H/cm$^2$,
- FIG. 3C is a picture of the surface of the implanted substrate after double implantation, a first lithium implantation at 210 keV with a dose of $10^{15}$ H/cm$^2$ followed by a second hydrogen implantation at 100 keV with a dose of $4.5.10^{16}$ H/cm$^2$,
- FIG. 3D is a picture of the surface of the implanted substrate after double implantation, a first lithium implantation at 210 keV with a dose of $10^{15}$ H/cm$^2$ followed by a second hydrogen implantation at 110 keV with a dose of $4.5.10^{16}$ H/cm$^2$.

The density of bubbles formed on the surfaces of the implanted Si substrate when the substrate is not attached to a support substrate is examined herein.

Figure 1A:
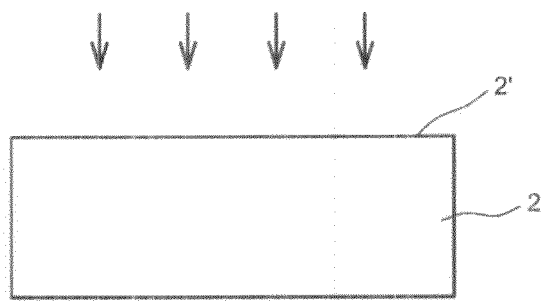
FIGS. 1A-1D represents steps from a known process.
Figure 1B:
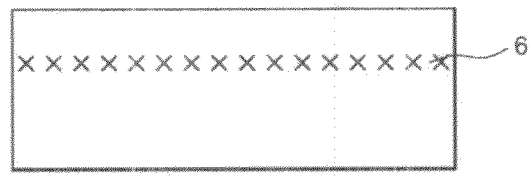
Figure 1C:
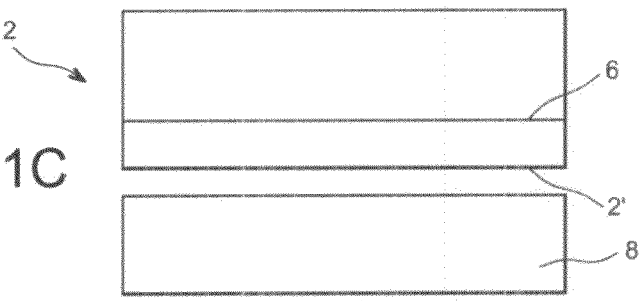
Figure 1D:
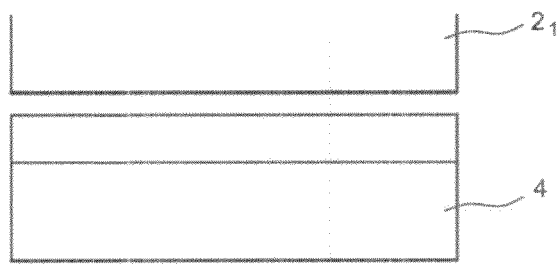

Indeed, these bubbles are signs of the presence of underlying microfractures, wherein the gas pressure (H$_2$ in the case of hydrogen implantation) gives rise to surface deformation; they are thus directly correlated with the microfractures formed when producing an assembly with a mounting substrate and forming a fracture, as in FIGS. 1C-1D in the case of implantation with hydrogen alone, or in FIGS. 2E-2F in the case of lithium-hydrogen co-implantation. The pictures in FIGS. 3A and 3B demonstrate that hydrogen implantation alone does not enable the formation of bubbles on the surface of the substrate.

On the other hand (FIGS. 3C and 3D), the introduction of Li by means of implantation, prior to hydrogen implantation, makes it possible to obtain highly developed bubbles, or even exfoliated areas, under the same annealing conditions as previously.

Therefore, this demonstrates the beneficial influence of double implantation according to the invention. Indeed, for the fracture formation process to function in a satisfactory manner, sufficient pressure in the cavities is sought. For low implantation depths, a (bonded or deposited) stiffener helps promote the lateral expansion of the microfractures and obtain the fracture formation. If this stiffener is not present (which is the case in the results presented herein), the pressure rise in the cavities gives rise to the appearance of bubbles on the surface or even exfoliated zones (these bubbles burst locally). If, without a stiffener, bubbles appear on the surface at a sufficient density, it would simply be necessary to add a stiffener to obtain a film transfer.

Therefore, to facilitate the study of the transfer mechanism, one studies the bubble formation in the absence of a stiffener.

Li—H co-implantation is thus a very effective means for reducing the thermal budget and/or the hydrogen dose required to obtain fracture formation.

Consequently, this enables, in particular, transferring on a substrate 19 having a thermal expansion coefficient (TEC) which is quite or very different to that of the first substrate 20. For example, this difference is at least $2.10^{-6}$/K or $3.10^{-6}$/K, which is particularly found in the case of a Si substrate on the one hand and a sapphire substrate on the other (TEC(Si)= $2.31.10^{-6}$/K and TEC(sapphire)=$6.35.10^{-6}$/K).

Examples of embodiments are now given.

Example 1

A substrate 20 made of Silicon (100) is provided with a 100 nm thick layer of thermal oxide SiO$_2$.

It is implanted under the following conditions, the steps being those in FIGS. 2A-2F:
- a first lithium implantation is performed, at an energy of 210 keV and with a dose of $10^{15}$/cm$^2$,
- a second hydrogen implantation is then performed, at an energy of 100 keV and with a dose of $4.5\times10^{16}$/cm$^2$.

The implanted substrate is then bonded onto a sapphire substrate 19 by means of direct or molecular bonding or assembly (FIG. 2E).

A Si/Sapphire heterostructure is obtained after bonding. As the thermal expansion coefficients (TEC) of Si and sapphire are very different (TEC Si=$2.31.10^{-6}$/K and TEC sapphire=$6.35.10^{-6}$/K), the Si/sapphire bond cannot be heated to a temperature greater than ~350° C.: above this temperature, systematic detachment of the structures is observed.

The fracture formation treatment then consists for example of annealing at 250° C. for 1 hour.

After fracture formation, a film of Si mounted on a Sapphire substrate is obtained.

By way of comparison, hydrogen implantation alone would have required, for the fracture formation annealing, a higher temperature, which would have resulted in the detachment of the Si and sapphire substrates, or in a longer annealing time, which is not industrially acceptable.

Example 2

A P-type Si substrate (111) undergoes lithium introduction by means of diffusion, under the following conditions:
- a layer of Li is firstly deposited on the Si surface by means of vacuum evaporation (at $2.10^{-6}$ Torr), at ambient temperature,
- the Li is then diffused in the Si, by means of vacuum annealing ($1.10^{-6}$ Torr), at 800° C. for 10 min.

The excess Li on the surface of the Si substrate is removed by rinsing the wafer in methanol.

Figure 4A:
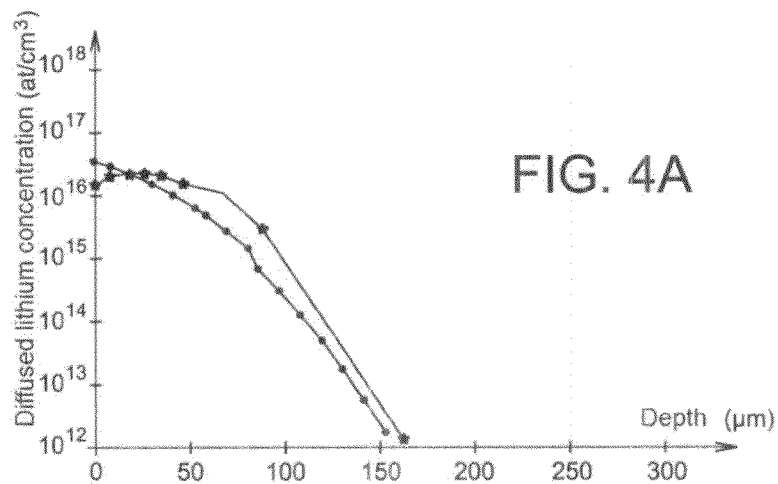
FIGS. 4A and 4B are diagrams giving, respectively, the diffused lithium concentration as a function of the Li depth and solubility in silicon.

This gives a typical diffusion profile, similar to that shown in FIG. 4A, taken from the article by A. Keffous et al. cited above, but with higher Li concentration levels (in this figure, the * symbols correspond to experimental values, with a diffusion temperature of 425° C. and a diffusion time of 4 min; the black circular dots correspond to PCID simulation results, under the same conditions). Indeed, the Li concentration on the surface of the substrate (or at a zero depth in FIG.

Figure 4B:
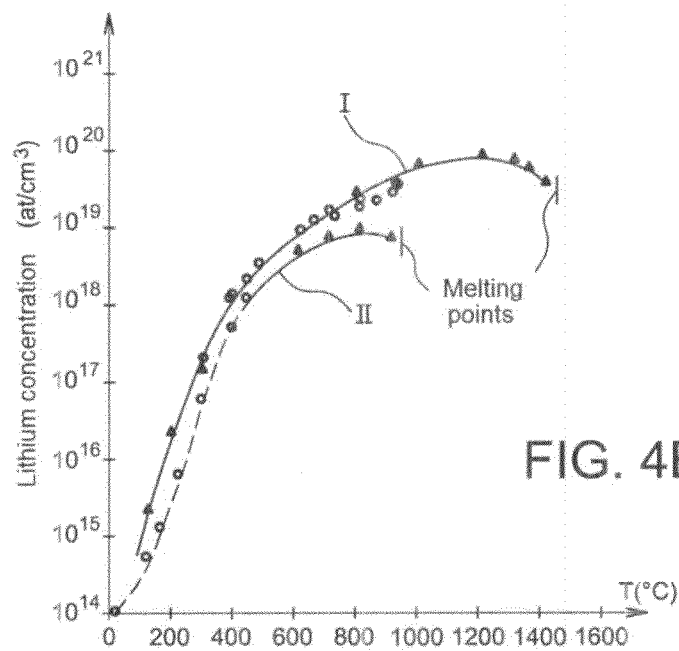

4A) corresponds to the solubility of Li in Si, wherein the curve is represented in FIG. 4B, taken from the article by C. S. Fuller, entitled "Interactions between solutes in Germanium and silicon", paper presented before the division of inorganic chemistry at the 134th meeting of the American Chemical Society, Chicago, Ill., 1958. At 800° C., the Li concentration in the Si substrate is ~$4.10^{19}/cm^{-3}$ from the surface to a depth of some microns below the surface. In FIG. 4B, the results relating to silicon are given in curve I, with curve II corresponding to germanium.

Hydrogen implantation is then carried out under the following conditions:
Hydrogen energy: 210 keV
dose: $4.10^{16}$ H/cm².

The implanted substrate is then bonded on a Si wafer 19 comprising a 400 nm thick oxide layer $SiO_2$ on the surface.

Fracture formation is induced thermally, by applying annealing in the range of 500° C.

In the case of implantation with hydrogen alone (at an energy of 210 keV and at a dose of $4.10^{16}$ H/cm²), it is impossible to obtain thermal fracture formation at 500° C., as the implantation dose is too low.

The example shown above clearly demonstrates that it is possible to lower the hydrogen dose required for the fracture formation, while only implementing a single implantation (with Li being introduced by means of diffusion, i.e. by means of a low-cost process).

This alternative embodiment is particularly advantageous for reducing the overall cost of a transfer process.

The invention claimed is:

1. A process for forming a layer of semiconductor material from a donor substrate comprising the semiconductor material, the process comprising:
    forming in the donor substrate a high lithium concentration zone, having a lithium concentration between $5\times10^{18}$ atoms/cm³ and $5\times10^{20}$ atoms/cm³, such that said high lithium concentration zone forms a trap for hydrogen,
    then implanting hydrogen in the donor substrate, in, or in the vicinity of, the high lithium concentration zone, to obtain an implanted donor substrate having a defined layer,
    assembling the implanted donor substrate with a stiffener, and
    detaching the defined layer from the donor substrate by heating the donor substrate.

2. The process of claim 1, wherein the donor substrate is heated to a temperature between 150° C. and 700° C. for a time between 1 minute and 1 month.

3. The process of claim 1, wherein the high lithium concentration zone is formed by lithium ion implantation.

4. The process of claim 3, wherein the lithium ion implantation is performed using a dose greater than $1\times10^{13}$/cm2.

5. The process of claim 1, wherein the high lithium concentration zone is formed by electrolysis or diffusion.

6. The process of claim 5, wherein the high lithium concentration zone is formed by diffusion, after deposition or evaporation of lithium on a surface of the donor substrate.

7. The process of claim 6, wherein the diffusion is performed by annealing.

8. The process of claim 1, wherein hydrogen ions are implanted at a dose between $10^{16}$ atoms/cm² and $5\times10^{17}$ atoms/cm².

9. The process of claim 1, wherein a mean implantation depth of hydrogen in the donor substrate is different from a mean depth of lithium by less than 200 nm.

10. The process of claim 1, wherein the assembly of the implanted donor substrate with the stiffener is of a molecular, direct assembly, or bonding type.

11. The process of claim 1, wherein the donor substrate comprises silicon.

12. The process of claim 11, wherein the silicon donor substrate is oxidized on a surface.

13. The process of claim 1, wherein the stiffener comprises sapphire.

14. The process of claim 1, wherein the donor substrate and the stiffener have thermal expansion coefficients differing, in absolute terms, by greater than $3\times10^{-6} K^{-1}$.

15. The process of claim 3, wherein the lithium ion implantation is performed at a dose between $10^{13}$/cm² and $5\times10^{15}$/cm2.

* * * * *